(12) United States Patent
Koch et al.

(10) Patent No.: US 11,728,778 B2
(45) Date of Patent: Aug. 15, 2023

(54) DIFFERENTIAL SIGNALING TRANSMISSION SYSTEMS

(71) Applicant: Analog Devices International Unlimited Company, Limerick (IE)

(72) Inventors: Andreas Koch, Wiesbaden (DE); Ralph McCormick, Haverhill, MA (US); Brian B. Moane, Raheen (IE)

(73) Assignee: Analog Devices International Unlimited Company, Limerick (IE)

( * ) Notice: Subject to any disclaimer, the term of this patent is extended or adjusted under 35 U.S.C. 154(b) by 250 days.

(21) Appl. No.: 17/137,273

(22) Filed: Dec. 29, 2020

(65) Prior Publication Data

US 2022/0209731 A1    Jun. 30, 2022

(51) Int. Cl.
   *H03F 3/45*    (2006.01)

(52) U.S. Cl.
   CPC ..... *H03F 3/45475* (2013.01); *H03F 3/45479* (2013.01); *H03F 2200/261* (2013.01); *H03F 2203/45138* (2013.01)

(58) Field of Classification Search
   CPC ............ H03F 3/45475; H03F 3/45479; H03F 2200/261; H03F 2203/45138; H03F 2203/45528; H03F 3/45632; H03F 3/45636
   See application file for complete search history.

(56) References Cited

U.S. PATENT DOCUMENTS

| | | |
|---|---|---|
| 6,768,352 B1 | 7/2004 | Maher et al. |
| 7,180,950 B2 | 2/2007 | Engel et al. |
| 7,385,466 B2 | 6/2008 | Suenaga et al. |
| 9,917,558 B1 | 3/2018 | Koch |
| 10,069,531 B2 | 9/2018 | Koch et al. |
| 2011/0243254 A1 | 10/2011 | Pischl |
| 2015/0303880 A1* | 10/2015 | Peng ................ H03F 1/26 330/260 |

FOREIGN PATENT DOCUMENTS

| | | |
|---|---|---|
| EP | 1434347 | 2/2007 |
| JP | 5197164 | 5/2013 |
| WO | 2006/040869 | 4/2006 |

OTHER PUBLICATIONS

Balasubramaniam et al. *Basic Design Considerations for Backplanes*, Application Report SZZA016B—Jun. 2001, Texas Instruments, 25 pages.

* cited by examiner

*Primary Examiner* — Jung Kim
(74) *Attorney, Agent, or Firm* — Knobbe, Martens, Olson & Bear, LLP

(57) ABSTRACT

A transceiver that may be implemented in low-voltage differential signaling (LVDS) transmission system or a multipoint LVDS transmission system, and corresponding systems are disclosed herein. The transceiver can filter a common-mode component of a differential input signal input into the transceiver while maintaining a high impedance for a differential-mode component of the differential input signal. The transceiver utilizes teeter-totter circuitry to maintain the high impedance for the differential-mode component of the differential input signal.

20 Claims, 5 Drawing Sheets

DIFFERENTIAL SIGNALING TRANSMISSION SYSTEMS

FIELD OF THE DISCLOSURE

This disclosure relates in general to the field of signal transmission, and more particularly, though not exclusively, to a system for differential signal transmission and common-mode component filtering.

BACKGROUND

Differential signaling transmission systems rely on a voltage difference between a voltage on a first line and a voltage on a second line to communicate data. As differential signaling transmission systems have advanced, the voltage difference between the two lines for communicating data has been reduced to save energy. Further, multiple transceivers for transmitting the data have been coupled to a single transmission line for transmission of the data among the multiple transceivers.

BRIEF DESCRIPTION OF THE DRAWINGS

The present disclosure is best understood from the following detailed description when read with the accompanying figures. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

SUMMARY OF THE DISCLOSURE

Figure 1:
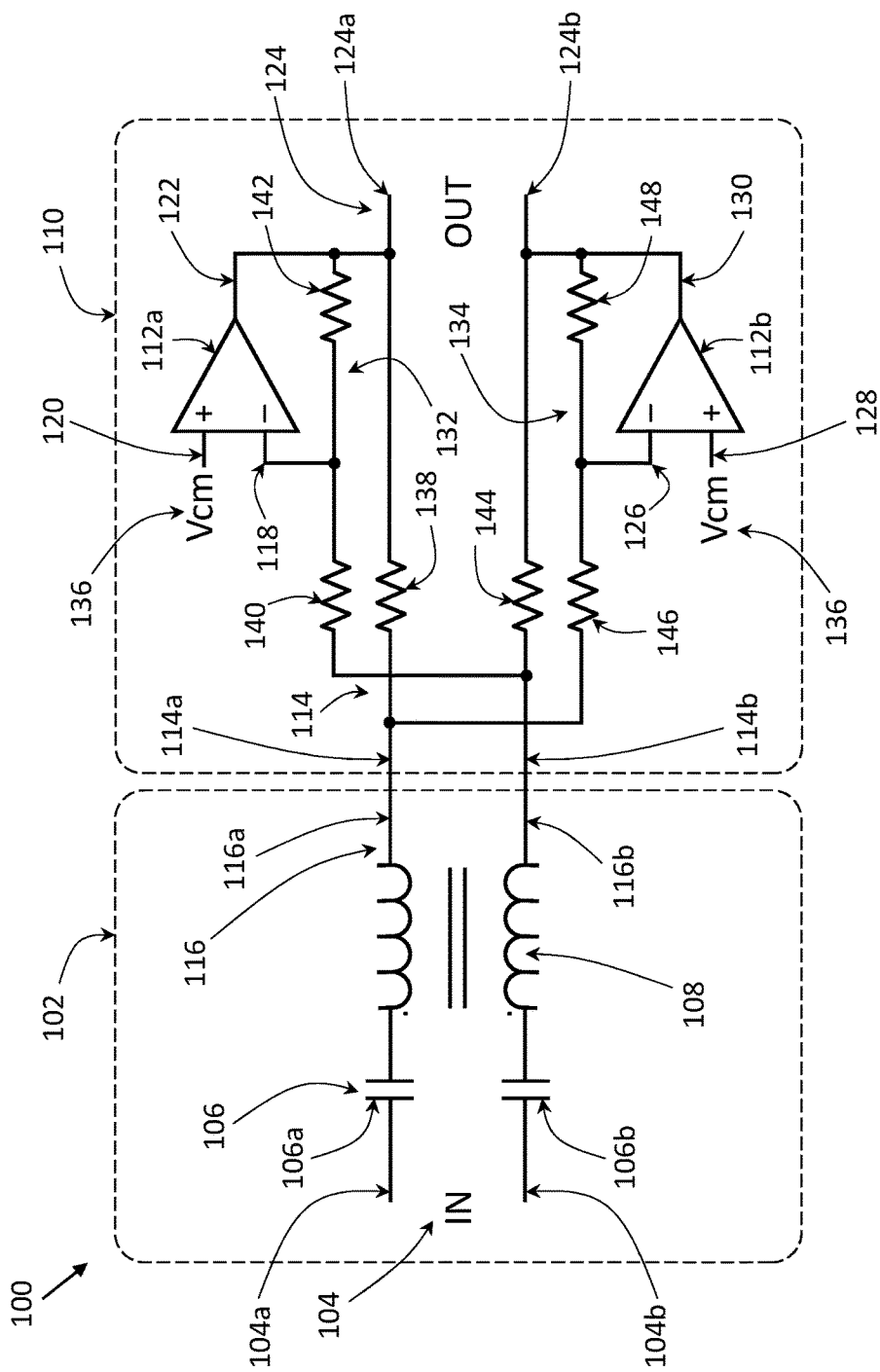
FIG. 1 illustrates an example transceiver, according to various embodiments of the disclosure.

A transceiver that may be implemented in low-voltage differential signaling (LVDS) transmission system or a multipoint LVDS (M-LVDS) transmission system, and corresponding systems are disclosed herein. The transceiver shows a low common-mode impedance allowing to filter the common-mode component of a differential input signal input into the transceiver while maintaining a high impedance for a differential-mode component of the differential input signal. The transceiver utilizes teeter-totter circuitry to maintain the high impedance for the differential-mode component of the differential input signal.

In certain embodiments disclosed herein, a transceiver, comprises filter circuitry including a common-mode choke, the common-mode choke circuitry to pass a differential-mode component of an input signal and filter a common-mode component of the input signal, and teeter-totter circuitry coupled between the common-mode choke circuitry and an output of the transceiver, the teeter-totter circuitry to provide high impedance for the differential-mode component of the input signal and low impedance for the common-mode component of the input signal.

In certain embodiments disclosed herein, a differential signal transmission system, comprises a first transceiver, including filter circuitry to implement band-pass filtering on a differential-mode component of an input signal of the first transceiver and to filter a common-mode component of the input signal of the first transceiver, teeter-totter circuitry coupled to the filter circuitry, the teeter-totter circuitry to provide high impedance for the differential-mode component of the input signal of the first transceiver and low impedance for the common-mode component of the input signal of the first transceiver, and a second transceiver coupled to the first transceiver via a transmission line.

In certain embodiments disclosed herein, a transceiver for a differential signal transmission system, comprising means for passing a differential-mode component of an input signal and filtering a common-mode component of the input signal, the means for passing coupled to an input of the transceiver, and means for providing high impedance for the differential-mode component of the input signal and providing low impedance for the common-mode component of the input signal.

DETAILED DESCRIPTION

As energy-saving has become a large concern in electrical systems, use of LVDS transmission systems have been implemented. Some systems, such as backplanes, have implemented multipoint LVDS (M-LVDS) transmission systems to allow communication between multiple points in a system. The LVDS transmission systems utilize a pair of lines to carry a differential signal, where a voltage difference between the paired lines indicates data being transmitted by the differential signal.

While the lower voltages of the LVDS transmission systems achieve energy savings as compared to other differential signaling transmission systems, noise on the lines of the LVDS transmission systems present an increased risk of the noise causing errors in the LVDS transmission systems as compared to other differential signaling transmission systems. For example, common-mode noise on the paired lines of a LVDS transmission system may cause the voltage on one or both of the paired lines to be outside of an acceptable range for the system. Accordingly, it can be beneficial to filter the common-mode component independently from the differential signal to prevent the voltage on the paired lines from being outside of the acceptable range for the system.

Filtering of the common-mode component of a differential signal while allowing the differential-mode component to pass can be implemented by having transceivers within the LVDS transmission systems with a common-mode choke and capacitors combination. However, the inclusion of a common-mode choke in legacy transceivers could cause a peak at a certain frequency in the frequency response of the transceivers that could cause resonation of signal components with the certain frequency. Further, including the common-mode choke and capacitors within the transceivers can cause a differential-mode impedance of the transmission line to be significantly reduced, thereby causing issues with interpreting the data being represented in the differential signal. Accordingly, it can be beneficial to include circuitry within the transceivers that provides a high differential-mode impedance. The transceiver disclosed herein can include teeter-totter circuitry that provides high differential-mode impedance, thereby allowing the use of a common-mode choke and capacitor combination that may not have been possible in legacy transmission systems.

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples, or in some cases across different figures. This repetition is for the purpose of simplicity and clarity and does not in itself dictate a specific relationship between the various embodiments and/or configurations discussed. Different embodiments may have different advantages, and no particular advantage is necessarily required of any embodiment.

FIG. 1 illustrates an example transceiver 100, according to various embodiments of the disclosure. The transceiver 100 may be implemented in a differential signal transmission system, where the transceiver 100 may be utilized for transmitting and/or receiving differential signals across a transmission line of the differential signal transmission system. In some embodiments, the differential signal transmission system may comprise an LVDS or an M-LVDS transmission system. Further, the differential signal transmission system may be implemented in a computer device in some embodiments, such as being implemented as a backplane or a backplane system. In some of these embodiments, the transmission line may comprise a bus, such as a full-duplex bus, a half-duplex bus, or any other differential signaling bus that can be implemented by a computer device.

The transceiver 100 may include filter circuitry 102. The filter circuitry 102 may be coupled to an input 104 of the transceiver 100. The input 104 may be coupled to an element that communicates via the transmission line or may be coupled to the transmission line. In some embodiments, the transceiver 100 or the differential signal transmission system in which the transceiver 100 is implemented includes switching circuitry that can alternate coupling of the input 104 between being coupled to an element that communicates via the transmission line and being coupled to the transmission line.

The filter circuitry 102 may perform filtering on an input signal received via the input 104, wherein the input signal is a differential signal. For example, the filter circuitry 102 may implement band-pass filtering on the input signal. The filter circuitry 102 may include capacitors coupled to each of the input lines of the input 104. In particular, the input 104 includes a first input line 104a and a second input line 104b, where the input signal includes a first signal applied to the first input line 104a and a second signal applied to the second input line 104b and the difference between the signals on the first input line 104a and the second input line 104b defines the value of the differential signal. The capacitors 106 include a first capacitor 106a coupled to the first input line 104a and a second capacitor 106b coupled to the second input line 104b. The first capacitor 106a and the second capacitor 106b may filter low-frequency components from the signals on the first input line 104a and the second input line 104b. The capacitors 106 serve as Alternating Current (AC) coupling capacitors to allow AC component(s) of the input signal to pass through.

The filter circuitry 102 may further include a common-mode choke 108. The common-mode choke 108 may be coupled to the input 104 via the capacitors 106. In particular, a first coil of the common-mode choke 108 is coupled to the first input line 104a via the first capacitor 106a and a second coil of the common-mode choke 108 is coupled to the second input line 104b via the second capacitor 106b. The common-mode choke 108 may filter high-frequency components from the input signal. The combination of the capacitors 106 filtering the low-frequency components and the common-mode choke 108 filtering the high-frequency components may implement band-pass filtering on the input signal. In some embodiments, the filter circuitry 102 may include one or more additional components, such as resistors.

The transceiver 100 may further include teeter-totter circuitry 110. The teeter-totter circuitry 110 may be coupled to the filter circuitry 102. In particular, an input 114 of the teeter-totter circuitry 110 may be coupled to an output 116 of the filter circuitry 102. A first output line 116a of the filter circuitry 102 may be coupled to a first input line 114a of the teeter-totter circuitry 110 and a second output line 116b of the filter circuitry 102 may be coupled to a second input line 114b of the teeter-totter circuitry 110, where the first output line 116a and the first input line 114a correspond to the first input line 104a of the transceiver 100, and the second output line 116b and the second input line 114b correspond to the second input line 104b of the transceiver 100. The teeter-totter circuitry 110 may receive the input signal applied to the input 104 from the filter circuitry 102 with the filtering provided by the filter circuitry 102 having been applied to the input signal.

The common-mode choke 108 can be utilized within the transceiver 100 due to the features provided by the teeter-totter circuitry 110, which common-mode chokes could not be implemented in legacy transceivers. For example, the teeter-totter circuitry 110 may provide high impedance for differential-mode components of the input signal on the input 104 and low impedance for common-mode components of the input signal. Further, the teeter-totter circuitry 110 may allow for the impedance for the differential-mode components and the impedance for the common-mode components of the input signal to be set independently of each other. The high impedance for the differential-mode components can keep the transceiver 100 from overloading the transmission line while the low impedance for the common-mode components can prevent the voltage of the input signal from going outside of the allowed voltage limits for the differential signal transmission system in which the transceiver 100 is implemented. Further, the teeter-totter circuitry 110 may also provide for different frequency responses for the differential-mode components of the input signal and the common-mode components of the input signal. In particular, the teeter-totter circuitry 110 can allow the differential-mode components to be passed to the transmission line while rejecting most of the common-mode components. Based on the ability to provide different frequency response for the differential-mode components and the common-mode components, the transceiver 100 may be more robust than legacy transceivers implemented in the differential signal transmission systems.

The teeter-totter circuitry 110 may include one or more operational amplifiers. The operational amplifiers may comprise any type of inverting amplifiers, such as complementary metal-oxide-semiconductor (CMOS) inverters. The teeter-totter circuitry 110 includes a first operational amplifier 112a and a second operational amplifier 112b. The first operational amplifier 112a may have an inverting input 118 coupled to the second input line 114b. A non-inverting input 120 of the first operational amplifier 112a may receive a common-mode voltage 136. The common-mode voltage 136 may be a reference voltage. The common-mode voltage 136 can be a desired common-mode voltage for a signal being output on an output 124 of the transceiver 100. Further, an output 122 of the first operational amplifier 112a may be coupled to a first output line 124a of the transceiver 100. The teeter-totter circuitry 110 may further include a first feedback loop 132 that couples the output 122 of the first operational amplifier 112a with the inverting input 118 of the first operational amplifier 112a.

The second operational amplifier 112b may have an inverting input 126 coupled to the first input line 114a. A non-inverting input 128 of the second operational amplifier 112b may receive the common-mode voltage 136. Further, an output 130 of the second operational amplifier 112b may be coupled to a second output line 124b of the transceiver 100. The teeter-totter circuitry 110 may further include a second feedback loop 134 that couples the output 130 of the second operational amplifier 112b with the inverting input 126 of the second operational amplifier 112b.

The crosswise arrangement of the first operational amplifier 112a and the second operational amplifier 112b cause the outputs of the first operational amplifier 112a and the second operational amplifier 112b to follow the differential-mode components of the inputs to the operational amplifiers, thereby maintaining a low current flow of the differential-mode components of the signal into the outputs of the operational amplifiers. Applying the common-mode voltage 136 to the non-inverting input 120 of the first operational amplifier 112a and to the non-inverting input 128 of the second operational amplifier 112b causes current of the common-mode components of the signal to flow into the outputs of the operational amplifiers, where the amount of current flow of the common-mode components into the outputs of the operational amplifiers is greater than the amount of current flow of the differential-mode components into the outputs of the operational amplifiers.

The teeter-totter circuitry 110 may further include one or more resistors. For example, the teeter-totter circuitry 110 may include a first resistor 138. The first resistor 138 may be coupled between the first input line 114a and the first output line 124a, and may provide a path between the first input line 114a and the first output line 124a that bypasses the first operational amplifier 112a and the second operational amplifier 112b. The teeter-totter circuitry 110 may further include a second resistor 140 and a third resistor 142. The second resistor 140 may be coupled between the second input line 114b and the inverting input 118 of the first operational amplifier 112a. The third resistor 142 may be coupled between the inverting input 118 of the first operational amplifier 112a and the output 122 of the first operational amplifier 112a, where the third resistor 142 is part of the first feedback loop 132. The second resistor 140 and the third resistor 142 may define a gain provided by the first operational amplifier 112a. Based on the differing current flow into the output 122 of the first operational amplifier 112a and the values of the second resistor 140 and the third resistor 142, the voltage of the differential-mode component of the signal on the first input line 114a may be amplified while the voltage of the common-mode component of the signal on the first input line 114a may be attenuated. In some embodiments, the voltage of the differential-mode component of the signal on the first input line 114a may be maintained while the common-mode component of the signal on the first input line 114a may be attenuated. In other embodiments, the voltage of the differential-mode component of the signal on the first input line 114a may be amplified while the voltage of the common-mode component of the signal on the first input line 114a may be maintained or attenuated.

The teeter-totter circuitry 110 may further include a fourth resistor 144. The fourth resistor 144 may be coupled between the second input line 114b and the second output line 124b, and may provide a path between the second input line 114b and the second output line 124b that bypasses the first operational amplifier 112a and the second operational amplifier 112b. The teeter-totter circuitry 110 may further include a fifth resistor 146 and a sixth resistor 148. The fifth resistor 146 may be coupled between the first input line 114a and the inverting input 126 of the second operational amplifier 112b. The sixth resistor 148 may be coupled between the inverting input 126 of the second operational amplifier 112b and the output 130 of the second operational amplifier 112b, where the sixth resistor 148 is part of the second feedback loop 134. The fifth resistor 146 and the sixth resistor 148 may define a gain provided by the second operational amplifier 112b. Based on the differing current flow into the output 130 of the second operational amplifier 112b and the values of the fifth resistor 146 and the sixth resistor 148, the voltage of the differential-mode component of the signal on the second input line 114b may be amplified while the voltage of the common-mode component of the signal on the second input line 114b may be attenuated. In some embodiments, the voltage of the differential-mode component of the signal on the second input line 114b may be maintained while the common-mode component of the signal on the second input line 114b may be attenuated. In other embodiments, the voltage of the differential-mode component of the signal on the second input line 114b may be amplified while the voltage of the common-mode component of the signal on the second input line 114b may be maintained or attenuated.

The output 124 may be coupled to the transmission line or to an element that communicates via the transmission line. In some embodiments, the transceiver 100 or the differential signal transmission system in which the transceiver 100 is implemented includes switching circuitry that can alternate coupling of the output 124 between being coupled to an element that communicates via the transmission line and being coupled to the transmission line. The transceiver 100 may output on the output 124 a modified version of the input signal received on the input 104, where the modified version of the input signal has at least a portion of the common-mode component filtered out from the original input signal.

While the transceiver 100 illustrated includes a single filter circuitry 102 and a single teeter-totter circuitry 110, transceivers in other embodiments may include two or more filter circuitries and two or more single teeter-totter circuitries, where each of the filter circuitries includes one or more of the features of the filter circuitry 102 and each of the teeter-totter circuitries includes one or more of the features of the teeter-totter circuitry 110. For example, a transceiver may include two filter circuitries and two teeter-totter circuitries in some embodiments. A first one of the filter circuitries may be coupled at an input to an element that communicates via the transmission line. A first one of the teeter-totter circuitries is coupled at an input to the output of the first one of the filter circuitries and at an output to a transmission line. A second one of the filter circuitries may be coupled at an input to the transmission line. A second one of the teeter-totter circuitries is coupled at an input to the output of the second one of the filter circuitries and at an output to an element that communicates via the transmission line.

Figure 2:
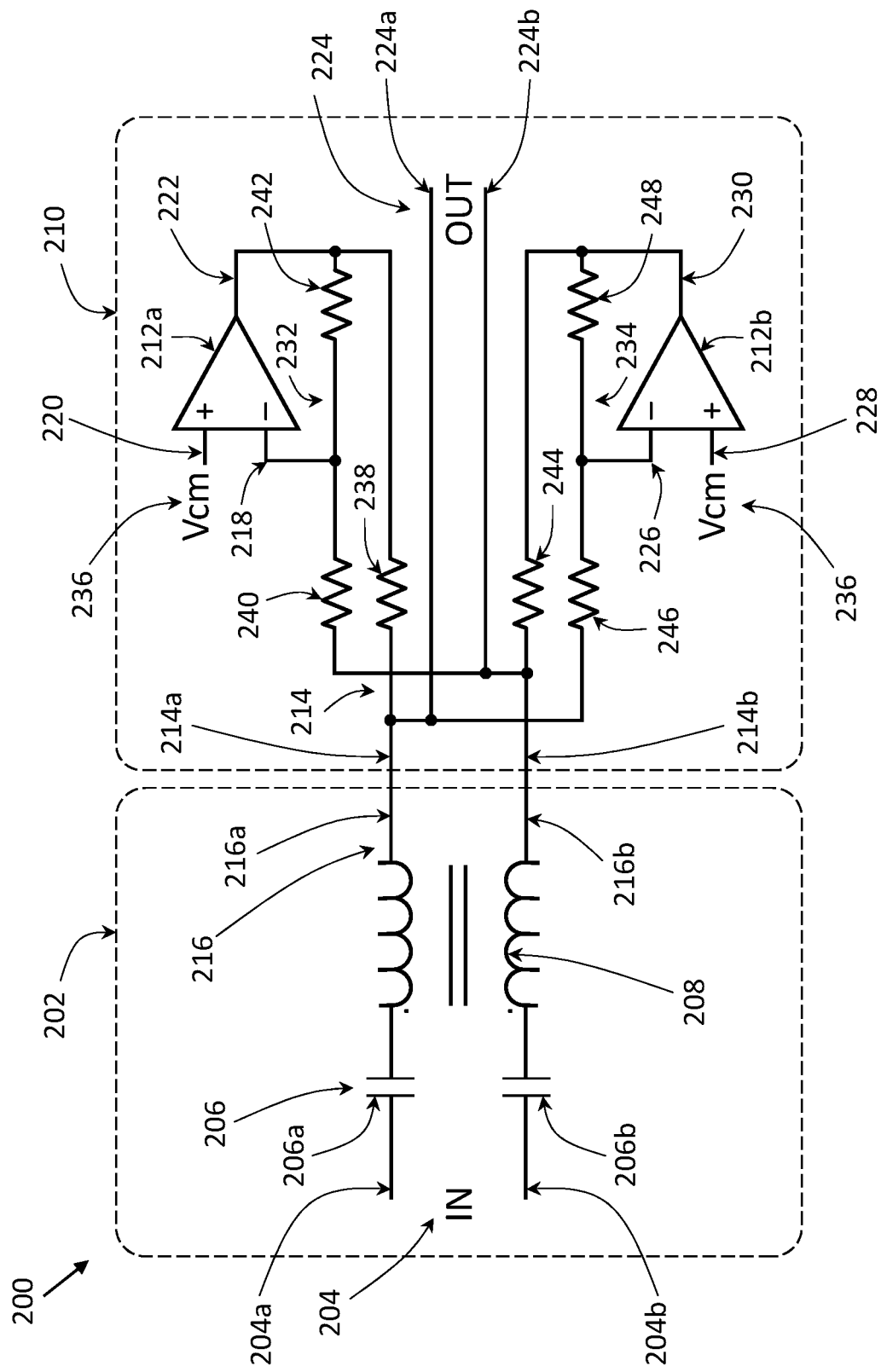
FIG. 2 illustrates another example transceiver, according to various embodiments of the disclosure.

FIG. 2 illustrates another example transceiver 200, according to various embodiments of the disclosure. The transceiver 200 may be implemented in a differential signal transmission system, where the transceiver 200 may be utilized for transmitting and/or receiving differential signals across a transmission line of the differential signal transmission system. In some embodiments, the differential signal transmission system may comprise an LVDS or an M-LVDS transmission system. Further, the differential signal transmission system may be implemented in a computer device in some embodiments, such as being implemented as a backplane or a backplane system. In some of these embodiments, the transmission line may comprise a bus, such as a full-duplex bus, a half-duplex bus, or any other differential signaling bus that can be implemented by a computer device.

The transceiver 200 may include filter circuitry 202. The filter circuitry 202 may be coupled to an input 204 of the transceiver 200. The input 204 may be coupled to an element that communicates via the transmission line or may be coupled to the transmission line. In some embodiments, the transceiver 200 or the differential signal transmission system in which the transceiver 200 is implemented includes switching circuitry that can alternate coupling of the input 204 between being coupled to an element that communicates via the transmission line and being coupled to the transmission line.

The filter circuitry 202 may perform filtering on an input signal received via the input 204, wherein the input signal is a differential signal. For example, the filter circuitry 202 may implement band-pass filtering on the input signal. The filter circuitry 202 may include capacitors 206 coupled to each of the input lines of the input 204. In particular, the input 204 includes a first input line 204a and a second input line 204b, where the input signal includes a first signal applied to the first input line 204a and a second signal applied to the second input line 204b and the difference between the signals on the first input line 204a and the second input line 204b defines the value of the differential signal. The capacitors 206 include a first capacitor 206a coupled to the first input line 204a and a second capacitor 206b coupled to the second input line 204b. The first capacitor 206a and the second capacitor 206b may filter low-frequency components from the signals on the first input line 204a and the second input line 204b. The capacitors 206 serve as AC coupling capacitors to allow AC component(s) of the input signal to pass through.

The filter circuitry 202 may further include a common-mode choke 208. The common-mode choke 208 may be coupled to the input 204 via the capacitors 206. In particular, a first coil of the common-mode choke 208 is coupled to the first input line 204a via the first capacitor 206a and a second coil of the common-mode choke 208 is coupled to the second input line 204b via the second capacitor 206b. The common-mode choke 208 may filter high-frequency components from the input signal. The combination of the capacitors 206 filtering the low-frequency components and the common-mode choke 208 filtering the high-frequency components may implement band-pass filtering on the input signal. In some embodiments, the filter circuitry 202 may include one or more additional components, such as resistors.

The transceiver 200 may further include teeter-totter circuitry 210. The teeter-totter circuitry 210 may be coupled to the filter circuitry 202. In particular, an input 214 of the teeter-totter circuitry 210 may be coupled to an output 216 of the filter circuitry 202. A first output line 216a of the filter circuitry 202 may be coupled to a first input line 214a of the teeter-totter circuitry 210 and a second output line 216b of the filter circuitry 202 may be coupled to a second input line 214b of the teeter-totter circuitry 210, where the first output line 216a and the first input line 214a correspond to the first input line 204a of the transceiver 200, and the second output line 216b and the second input line 214b correspond to the second input line 204b of the transceiver 200. The teeter-totter circuitry 210 may receive the input signal applied to the input 204 from the filter circuitry 202 with the filtering provided by the filter circuitry 202 having been applied to the input signal.

The common-mode choke 208 can be utilized within the transceiver 200 due to the features provided by the teeter-totter circuitry 210, which common-mode chokes could not be implemented in legacy transceivers. For example, the teeter-totter circuitry 210 may provide high impedance for differential-mode components of the input signal on the input 204 and low impedance for common-mode components of the input signal. Further, the teeter-totter circuitry 210 may allow for the impedance for the differential-mode components and the impedance for the common-mode components of the input signal to be set independently of each other. The high impedance for the differential-mode components can keep the transceiver 200 from overloading the transmission line while the low impedance for the common-mode components can prevent the voltage of the input signal from going outside of the allowed voltage limits for the differential signal transmission system in which the transceiver 200 is implemented. Further, the teeter-totter circuitry 210 may also provide for different frequency responses for the differential-mode components of the input signal and the common-mode components of the input signal. In particular, the teeter-totter circuitry 210 can allow the differential-mode components to be passed to the transmission line while rejecting most of the common-mode components. Based on the ability to provide different frequency response for the differential-mode components and the common-mode components, the transceiver 200 may be more robust than legacy transceivers implemented in the differential signal transmission systems.

The teeter-totter circuitry 210 may include one or more operational amplifiers. The operational amplifiers may comprise any type of inverting amplifiers, such as CMOS inverters. The teeter-totter circuitry 210 includes a first operational amplifier 212a and a second operational amplifier 212b. The first operational amplifier 212a may have an inverting input 218 coupled to the second input line 214b. A non-inverting input 220 of the first operational amplifier 212a may receive a common-mode voltage 236. The common-mode voltage 236 may comprise a reference voltage. The common-mode voltage 236 can be a desired common-mode voltage for a signal being output on an output 224 of the transceiver 200. The teeter-totter circuitry 210 may include a first feedback loop 232 that couples the output 222 of the first operational amplifier 212a with the inverting input 218 of the first operational amplifier 212a.

The second operational amplifier 212b may have an inverting input 226 coupled to the first input line 214a. A non-inverting input 228 of the second operational amplifier 212b may receive the common-mode voltage 236. The teeter-totter circuitry 210 may include a second feedback loop 234 that couples the output 230 of the second operational amplifier 212b with the inverting input 226 of the second operational amplifier 212b.

The crosswise arrangement of the first operational amplifier 212a and the second operational amplifier 212b cause the outputs of the first operational amplifier 212a and the second operational amplifier 212b to follow the differential-mode components of the inputs to the operational amplifiers, thereby maintaining a low current flow of the differential-mode components of the signal into the outputs of the operational amplifiers. Applying the common-mode voltage 236 to the non-inverting input 220 of the first operational amplifier 212a and to the non-inverting input 228 of the second operational amplifier 212b causes current of the common-mode components of the signal to flow into the outputs of the operational amplifiers, where the amount of current flow of the common-mode components into the outputs of the operational amplifiers is greater than the amount of current flow of the differential-mode components into the outputs of the operational amplifiers.

The teeter-totter circuitry 210 may further include one or more resistors. For example, the teeter-totter circuitry 210 may include a first resistor 238. The first resistor 238 may be coupled between the first input line 214a and the output 222 of the first operational amplifier 212a. The teeter-totter circuitry 210 may further include a second resistor 240 and a third resistor 242. The second resistor 240 may be coupled between the second input line 214b and the inverting input 218 of the first operational amplifier 212a. The third resistor 242 may be coupled between the inverting input 218 of the first operational amplifier 212a and the output 222 of the first operational amplifier 212a, where the third resistor 242 is part of the first feedback loop 232. The second resistor 240 and the third resistor 242 may define a gain provided by the first operational amplifier 212a. Based on the differing current flow into the output 222 of the first operational amplifier 212a and the values of the second resistor 240 and the third resistor 242, the voltage of the differential-mode component of the signal on the first input line 214a may be amplified while the voltage of the common-mode component of the signal on the first input line 214a may be attenuated. In some embodiments, the voltage of the differential-mode component of the signal on the first input line 214a may be maintained while the common-mode component of the signal on the first input line 214a may be attenuated. In other embodiments, the voltage of the differential-mode component of the signal on the first input line 214a may be amplified while the voltage of the common-mode component of the signal on the first input line 214a may be maintained or attenuated.

The teeter-totter circuitry 210 may further include a fourth resistor 244. The fourth resistor 244 may be coupled between the second input line 214b and the output of the second operational amplifier 212b. The teeter-totter circuitry 210 may further include a fifth resistor 246 and a sixth resistor 248. The fifth resistor 246 may be coupled between the first input line 214a and the inverting input 226 of the second operational amplifier 212b. The sixth resistor 248 may be coupled between the inverting input 226 of the second operational amplifier 212b and the output 230 of the second operational amplifier 212b, where the sixth resistor 248 is part of the second feedback loop 234. The fifth resistor 246 and the sixth resistor 248 may define a gain provided by the second operational amplifier 212b. Based on the differing current flow into the output 230 of the second operational amplifier 212b and the values of the fifth resistor 246 and the sixth resistor 248, the voltage of the differential-mode component of the signal on the second input line 214b may be amplified while the voltage of the common-mode component of the signal on the second input line 214b may be attenuated. In some embodiments, the voltage of the differential-mode component of the signal on the second input line 214b may be maintained while the common-mode component of the signal on the second input line 214b may be attenuated. In other embodiments, the voltage of the differential-mode component of the signal on the second input line 214b may be amplified while the voltage of the common-mode component of the signal on the second input line 214b may be maintained or attenuated.

The input 214 of the teeter-totter circuitry 210 may be coupled to the output 224 of the teeter-totter circuitry 210. In particular, the first input line 214a may be coupled to a first output line 224a of the output 224, and the second input line 214b may be coupled to a second output line 224b of the output 224. In the illustrated embodiment, the first input line 214a is shown directly coupled to first output line 224a and the second input line 214b is shown directly coupled to the second output line 224b. In other embodiments, one or more components (such as resistors) may be coupled between the input lines and the output lines. The filter circuitry 202 and the teeter-totter circuitry 210 may operate on the signals on the output lines. For example, the voltage of the differential-mode component of the signals on the output lines may be amplified while the voltage of the common-mode component of the signals on the output lines may be maintained or attenuated. The transceiver 200 having the input 214 of the teeter-totter circuitry 210 coupled to the output 224 of the teeter-totter circuitry 210 may allow the transceiver 200 to operate on signals entering from the input 204, signals entering from the output 224, or bidirectional signals that enter from either the input 204 or the output 224.

The output 224 may be coupled to the transmission line or to an element that communicates via the transmission line. In some embodiments, the transceiver 200 or the differential signal transmission system in which the transceiver 200 is implemented includes switching circuitry that can alternate coupling of the output 224 between being coupled to an element that communicates via the transmission line and being coupled to the transmission line. The transceiver 200 may output on the output 224 a modified version of the input signal received on the input 204, where the modified version of the input signal has at least a portion of the common-mode component filtered out from the original input signal.

While the transceiver 200 illustrated includes a single filter circuitry 202 and a single teeter-totter circuitry 210, transceivers in other embodiments may include two or more filter circuitries and two or more single teeter-totter circuitries, where each of the filter circuitries include one or more of the features of the filter circuitry 202 and each of the teeter-totter circuitries include one or more of the features of the teeter-totter circuitry 210. For example, a transceiver may include two filter circuitries and two teeter-totter circuitries in some embodiments. A first one of the filter circuitries may be coupled at an input to an element that communicates via the transmission line. A first one of the teeter-totter circuitries is coupled at an input to the output of the first one of the filter circuitries and at an output to a transmission line. A second one of the filter circuitries may be coupled at an input to the transmission line. A second one of the teeter-totter circuitries is coupled at an input to the output of the second one of the filter circuitries and at an output to an element that communicates via the transmission line.

Figures 3, 4:
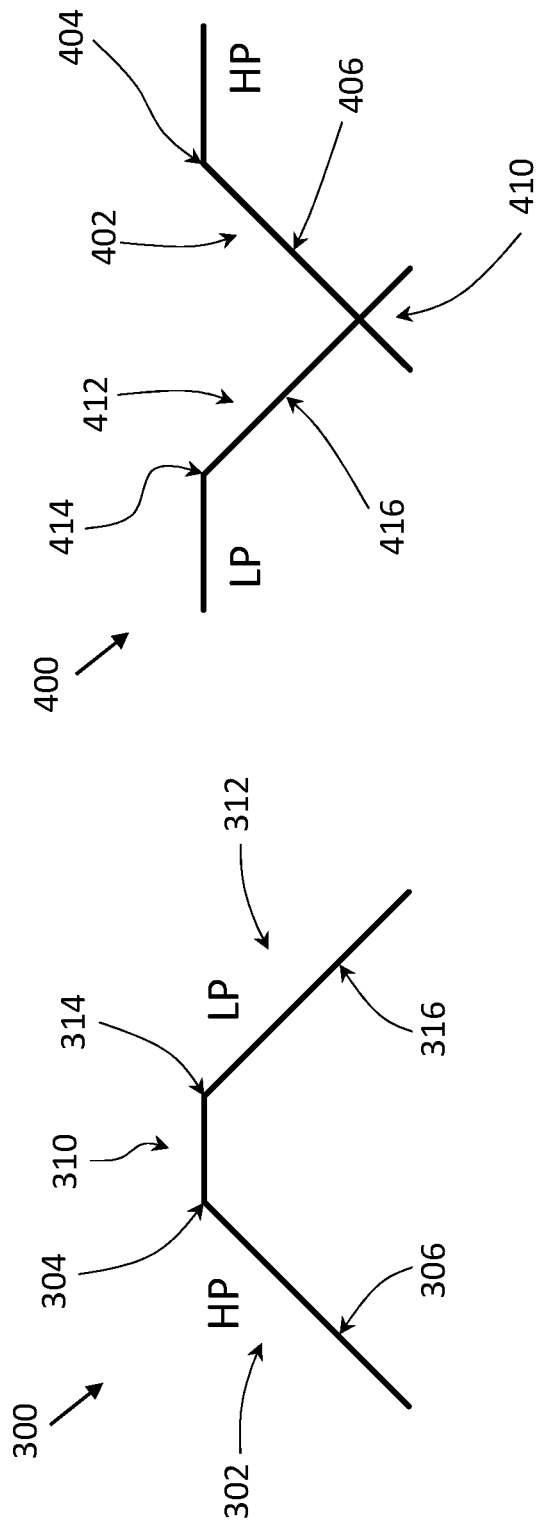
FIG. 3 illustrates a graph illustrating example filtering of differential-mode components via the transceiver of FIG. 1, according to various embodiments of the disclosure.
FIG. 4 illustrates a graph illustrating example filtering of common-mode components via the transceiver of FIG. 1, according to various embodiments of the disclosure.

FIG. 3 illustrates a graph 300 illustrating example filtering of differential-mode components via the transceiver 100 of FIG. 1, according to various embodiments of the disclosure. In particular, the graph 300 illustrates a frequency response of the transceiver 100 for differential-mode components of an input signal input into the transceiver 100.

As can be seen from the graph 300, the frequency response for the differential-mode components may be a band-pass response, where the transceiver 100 may act as a band-pass filter for the differential-mode components of the input signal input into the transceiver 100. In particular, the frequency response of the transceiver 100 includes a pass region 310 where differential-modes components of an input signal to the transceiver 100 are passed without being attenuated or approximately (within 5%) a least amount of attenuation providable by the transceiver 100.

The band-pass filter response of the transceiver 100 may be formed by a combination of a high-pass filter produced by the capacitors 106 (FIG. 1) and a low-pass filter produced by the common-mode choke 108 (FIG. 1). The high-pass filter produces a low-frequency attenuation region 302. The low-frequency attenuation region 302 illustrates that the transceiver 100 attenuates differential-mode components of input signals with a frequency less than the frequency represented by high-pass threshold 304. The low-frequency attenuation region 302 includes an attenuation region 306. The transceiver 100 at least partially attenuates differential-mode components of an input signal with frequencies within the range of frequencies corresponding to the attenuation region 306. The amount of attenuation within the attenuation region 306 may increase for lower frequencies within the attenuation region 306. While the attenuation region 306 is shown with a constant amount of increase of the attenuation as the frequency decreases (as shown by a slope of the line representing the attenuation region 306 being constant), it should be understood that the amount of increase of the attenuation may vary as the frequency decreases such that the amount of increase may not be constant and/or the amount of attenuation may not increase at certain frequencies within the attenuation region 306.

The low-pass filter produces a high-frequency attenuation region 312. The high-frequency attenuation region 312 illustrates that the transceiver 100 attenuates differential-mode components of input signals with a frequency greater than the frequency represented by low-pass threshold 314. The high-frequency attenuation region 312 includes an attenuation region 316. The transceiver 100 at least partially attenuates differential-mode components of an input signal with frequencies within the range of frequencies corresponding to the attenuation region 316. The amount of attenuation within the attenuation region 316 may increase for higher frequencies within the attenuation region 316. While the attenuation region 316 is shown with a constant amount of increase of the attenuation as the frequency increases (as shown by a slope of the line representing the attenuation region 316 being constant), it should be understood that the amount of increase of the attenuation may vary as the frequency increases such that the amount of increase may not be constant and/or the amount of attenuation may not increase at certain frequencies within the attenuation region 316.

As can be seen from the graph 300, the high-pass threshold 304 is at a lower frequency than the low-pass threshold 314 in the illustrated embodiment. The high-pass threshold 304 being at a lower frequency than the low-pass threshold 314 can create the pass region 310. The frequencies corresponding to the high-pass threshold 304 and the low-pass threshold 314 may be defined by the values of the capacitors 106, the common-mode choke 108, and/or the resistors of the teeter-totter circuitry 110 (FIG. 1). The values of the capacitors 106, the common-mode choke 108, and/or the resistors may be selected to provide the desired frequencies for the high-pass threshold 304 and the low-pass threshold 314 for implementations of the transceiver 100.

FIG. 4 illustrates a graph 400 illustrating example filtering of common-mode components via the transceiver 100 of FIG. 1, according to various embodiments of the disclosure. In particular, the graph 400 illustrates a frequency response of the transceiver 100 for common-mode components of an input signal input into the transceiver 100.

As can be seen from the graph 400, the frequency response for the common-mode components may attenuate common-mode components of all frequencies of the input signal. In particular, the frequency response may comprise a high-pass filter response and a low-pass filter response, where the filtering of the high-pass filter response and the low-pass filter response overlap to attenuate common-mode components of all frequencies of the input signal.

The high-pass filter produces a low-frequency attenuation region 402. The low-frequency attenuation region 402 illustrates that the transceiver 100 attenuates common-mode components of input signals with a frequency less than the frequency represented by high-pass threshold 404. The low-frequency attenuation region 402 includes an attenuation region 406. The transceiver 100 at least partially attenuates common-mode components of an input signal with frequencies within the range of frequencies corresponding to the attenuation region 406. The amount of attenuation within the attenuation region 406 may increase for lower frequencies within the attenuation region 406. While the attenuation region 406 is shown with a constant amount of increase of the attenuation as the frequency decreases (as shown by a slope of the line representing the attenuation region 406 being constant), it should be understood that the amount of increase of the attenuation may vary as the frequency decreases such that the amount of increase may not be constant and/or the amount of attenuation may not increase at certain frequencies within the attenuation region 406.

The low-pass filter produces a high-frequency attenuation region 412. The high-frequency attenuation region 412 illustrates that the transceiver 100 attenuates common-mode components of input signals with a frequency greater than the frequency represented by low-pass threshold 414. The high-frequency attenuation region 412 includes an attenuation region 416. The transceiver 100 at least partially attenuates common-mode components of an input signal with frequencies within the range of frequencies corresponding to the attenuation region 416. The amount of attenuation within the attenuation region 416 may increase for higher frequencies within the attenuation region 416. While the attenuation region 416 is shown with a constant amount of increase of the attenuation as the frequency increases (as shown by a slope of the line representing the attenuation region 406 being constant), it should be understood that the amount of increase of the attenuation may vary as the frequency increase such that the amount of increase may not be constant and/or the amount of attenuation may not increase at certain frequencies within the attenuation region 416.

As can be seen from the graph 400, the high-pass threshold 404 is at a higher frequency than the low-pass threshold 414 in the illustrated embodiment. Accordingly, the frequencies within the attenuation region 406 and/or the attenuation region 416 may overlap in embodiments. In the illustrated embodiment, the frequencies within the attenuation region 406 of the low-frequency attenuation region 402 and the attenuation region 416 of the high-frequency attenuation region 412 overlap. The common-mode components of the input signal may be attenuated by whichever of the high-pass filter (illustrated by the low-frequency attenuation region 402) or the low-pass filter (illustrated by the high-frequency attenuation region 412) provides a greater amount of attenuation for the frequency of the common-mode component. In the illustrated embodiment, the high-pass filter and the low-pass filter form an attenuation region 410, where the common-mode components with frequencies corresponding to the attenuation region 410 are at least partially attenuated. The frequencies corresponding to the high-pass threshold 404 and the low-pass threshold 414 may be defined by the values of the capacitors 106, the common-mode choke 108, and/or the resistors of the teeter-totter circuitry 110 (FIG. 1). The values of the capacitors 106, the common-mode choke 108, and the resistors may be the same as the values of the capacitors 106, the common-mode choke 108, and the resistors that produce the differential-mode component frequency response of graph 300, where the difference in the differential-mode component frequency response and the common-mode component frequency response may be due to the difference in differential-mode impedance and common-mode impedance provided by the teeter-totter circuitry 110.

Figure 5:
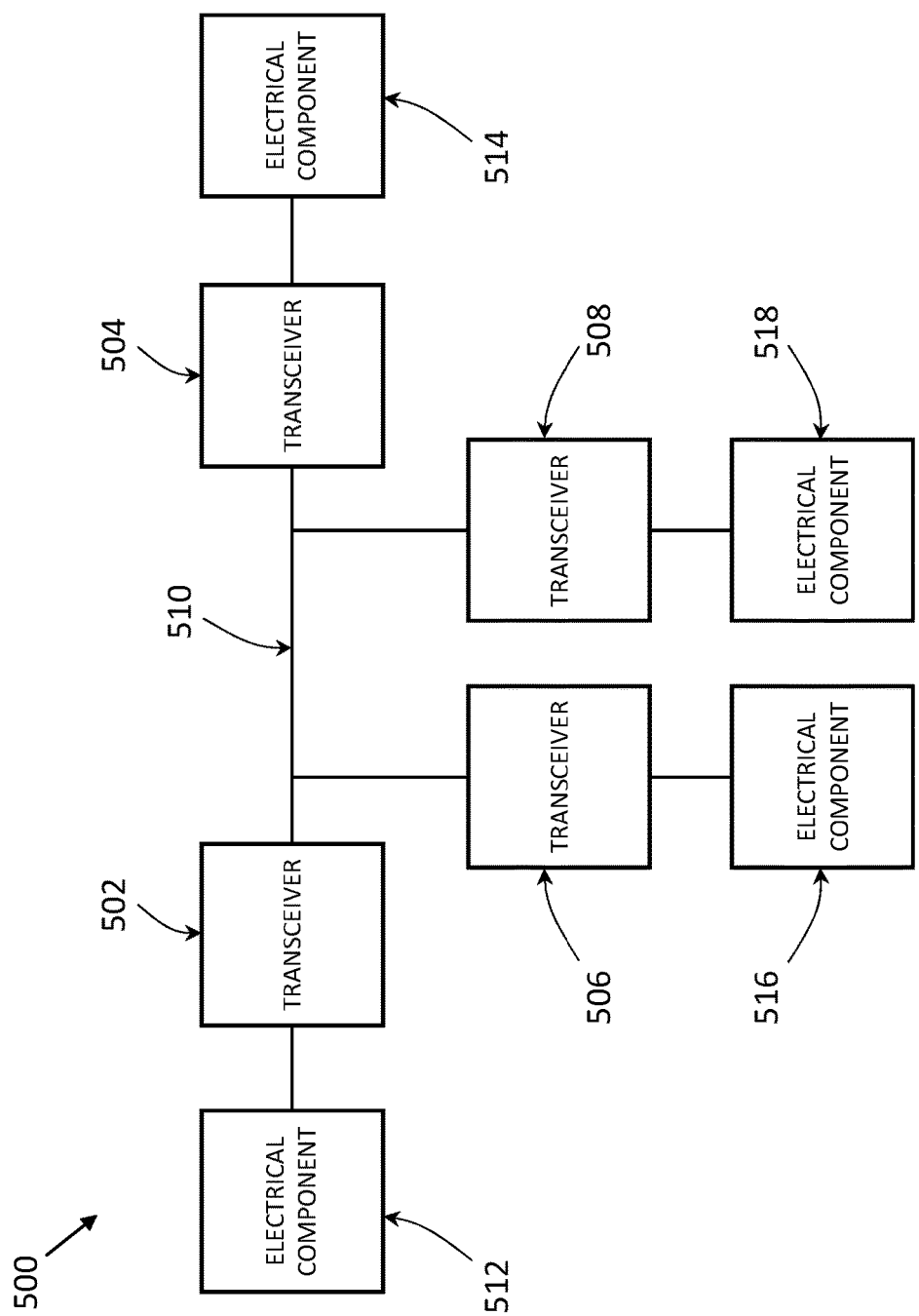
FIG. 5 illustrates an example transmission system, according to various embodiments of the disclosure.

FIG. 5 illustrates an example transmission system 500, according to various embodiments of the disclosure. The transmission system 500 may implement one or more transceivers having the features of the transceiver 100 (FIG. 1). The transmission system 500 may comprise an LVDS transmission system or an M-LVDS transmission system in embodiments. In the illustrated embodiment, the transmission system 500 comprises an M-LVDS transmission system. In some embodiments, the transmission system 500 may comprise a backplane system, an industrial equipment system, a system with frequency converters, or some combination thereof.

The transmission system 500 may comprise two or more transceivers. Each of the transceivers within the transmission system 500 may include the features of the transceiver 100. In the illustrated embodiment, the transmission system 500 includes four transceivers. In particular, the transmission system 500 includes a first transceiver 502, a second transceiver 504, a third transceiver 506, and a fourth transceiver 508. Each of the first transceiver 502, the second transceiver 504, and the third transceiver 506, and the fourth transceiver 508 may include the features of the transceiver 100.

The transmission system 500 may further include a transmission line 510. The transmission line 510 may comprise a one or more lines, where each of the lines may be paired with a corresponding line of the transmission line 510, and where differential signals may be transmitted via paired lines. The transmission line 510 may couple the transceivers of the transmission system 500 and allow for communication between the transceivers. For example, the transmission line 510 couples the first transceiver 502, the second transceiver 504, the third transceiver 506, and the fourth transceiver 508. In some embodiments, the transmission line 510 may comprise a bus that couples the transceivers. For example, the transmission line 510 may comprise a full-duplex bus or a half-duplex bus in some embodiments.

The transmission system 500 may further include one or more electrical components. The electrical components may comprise any component that can communicate differential signals. In some embodiments, the electrical components may comprise components of a computer device. Each of the transceivers may be coupled to a corresponding electrical component. Each of the electrical components may utilize the corresponding transceiver to communicate with the other electrical components. For example, the transmission system 500 includes a first electrical component 512, a second electrical component 514, a third electrical component 516, and a fourth electrical component 518 in the illustrated embodiment. The first electrical component 512 corresponds to the first transceiver 502 and may utilize the first transceiver 502 to communicate via the transmission line 510. The second electrical component 514 corresponds to the second transceiver 504 and may utilize the second transceiver 504 to communicate via the transmission line 510. The third electrical component 516 corresponds to the third transceiver 506 and may utilize the third transceiver 506 to communicate via the transmission line 510. The fourth electrical component 518 corresponds to the fourth transceiver 508 and may utilize the fourth transceiver 508 to communicate via the transmission line 510.

Each of the transceivers can be coupled to a corresponding electrical component and the transmission line. For example, each of the transceivers can include a first input line (such as the first input line 104a (FIG. 1)) and a second input line (such as the second input line 104b (FIG. 1)) that are coupled to paired differential lines of one of the corresponding electrical component or the transmission line, and a first output line (such as the first output line 124a (FIG. 1)) and a second output line (such as the second output line 124b (FIG. 1)) that are coupled to paired differential lines of the other of the corresponding electrical component or the transmission line. Differential signals may be applied to the transceivers via the first input lines and the second input lines, and the transceivers may output the filtered differential signals via the first output lines and the second output lines. In some embodiments, the transmission system 500 may include switches located between the electrical components and the transceivers, and switches located between the transceivers and the transmission line 510, where the switches can alternate the coupling of the inputs and the outputs between the corresponding electrical component and the transmission line 510.

In other embodiments, the transceivers can include two filter circuitries (such as the filter circuitry 102 (FIG. 1)) and two teeter-totter circuitries (such as the teeter-totter circuitry 110 (FIG. 1)). In these embodiments, the input of one of the filter circuitries is coupled to the corresponding electrical component and the corresponding teeter-totter circuitry coupled to the one of the filter circuitries is coupled at the output to the transmission line 510. The other of the filter circuitries is coupled at the input to the transmission line 510 and the corresponding teeter-totter circuitry coupled to the other of the filter circuitries is coupled at the output to the corresponding electrical component. In these embodiments, one of the filter circuitries and the teeter-totter circuitries can be utilized for transmitting differential signals and the other of the filter circuitries and the teeter-totter circuitries can be utilized for receiving differential signals.

While the transmission system 500 is illustrated with four transceivers, it should be understood that the transmission system 500 may include two or more transceivers in some embodiments. For example, the transmission system 500 may include 32 transceivers or more some embodiments. In some embodiments, the transmission system 500 may include an M-LVDS that includes three or more transceivers. In M-LVDS, the transceivers may appear in parallel and can result reduced resistance. The transceivers disclosed herein (such as the transceiver 100) provide a high impedance for differential-mode components of input signals, which can maintain a high impedance in M-LVDS for proper operation of the M-LVDS. The In other embodiments, the transmission system 500 may include an LVDS that includes two transceivers. For example, the transmission system 500 may include the first transceiver 502, the second transceiver 504, and the transmission line 510 may include in LVDS embodiments of the transmission system 500, whereas the third transceiver 506 and the fourth transceiver 508 may be omitted.

Figure 6:
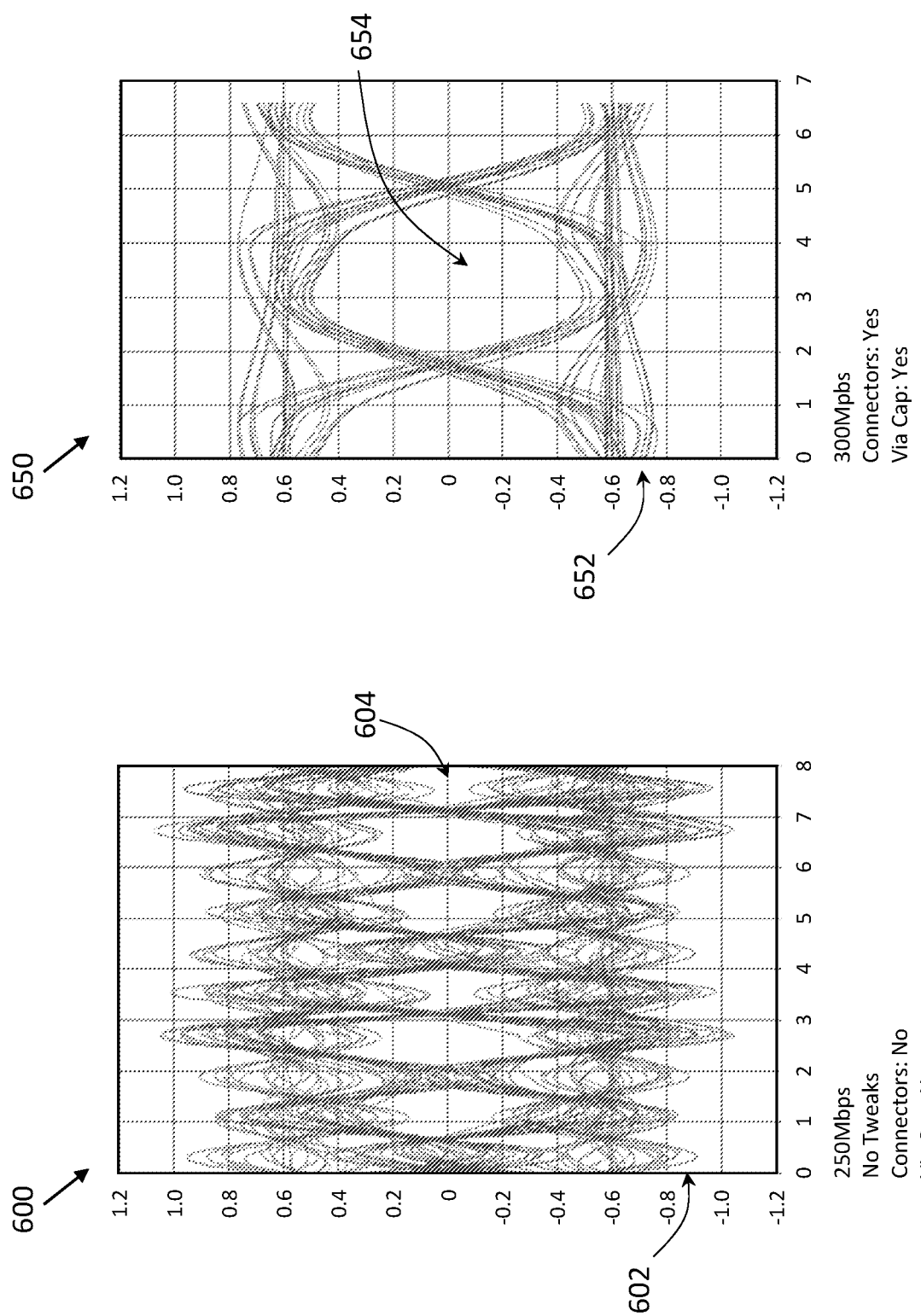
FIG. 6 illustrates eye diagrams illustrating an example transceiver output without low-pass filtering and an example transceiver output with low-pass filtering, according to various embodiments of the disclosure.

FIG. 6 illustrates eye diagrams illustrating an example transceiver output without low-pass filtering and an example transceiver output with low-pass filtering, according to various embodiments of the disclosure. In particular, eye diagram 600 illustrates an example output for a transceiver that does not implement low-pass filtering, such as legacy transceivers that cannot implement low-pass filtering. Eye diagram 650 illustrates an example output for a transceiver that implements low-pass filtering, such as the transceiver 100 (FIG. 1).

In the eye diagram 600, the signal representations 602 graphed show that the signals present significant noise. The signals illustrated may be at a frequency of 250 megabytes per second (Mbps). As can be seen from the eye diagram 600, the signal representations 602 graphed illustrate that the signals experience a significant amount of noise. Due to the noise, the eyes 604 of the eye diagram 600 are obscured and have signals extending into the eyes 604 due to the noise. The noise may be due to ringing of the signal presented due to the lack of low-pass filtering. To compensate for the noise, the frequency of the input signals may be limited to a lower frequency than input signals for transceivers that implement low-pass filtering, such as the transceiver 100, to allow time for the signal to settle in a state.

In the eye diagram 650, the signal representations 652 graphed show that the signals present less noise than the signals represented by the signal representations 602. The signals illustrated may be at a frequency of 400 Mbps. As can be seen from the eye diagram 650, the lack of noise on the signals cause a clear eye 654 to be presented by the eye diagram 650. The eye 654 indicates that the signals settled in states at the measured frequency, where the measured frequency of the eye diagram 650 is higher than the frequency of eye diagram 600. The settling of the signals indicates that transceivers with low-pass filtering, such as the transceiver 100, can operate at higher frequencies than transceivers without low-pass filtering, such as illustrated by the eye diagram 600.

EXAMPLE IMPLEMENTATIONS

The following examples are provided by way of illustration.

Example 1 may include a transceiver, comprising filter circuitry including a common-mode choke, the filter circuitry to pass a differential-mode component of an input signal and filter a common-mode component of the input signal, and teeter-totter circuitry coupled to the filter circuitry, the teeter-totter circuitry to provide high impedance for the differential-mode component of the input signal and low impedance for the common-mode component of the input signal.

Example 2 may include the transceiver of example 1, wherein the teeter-totter circuitry includes a first operational amplifier with an output of the first operational amplifier coupled to a first output line of the transceiver, wherein the first output line of the transceiver corresponds to a first input line of the transceiver, and wherein an input of the first operational amplifier is coupled to a second input line of the transceiver, and a second operational amplifier with an output of the second operational amplifier coupled to a second output line of the transceiver, wherein the second output line of the transceiver corresponds to the second input line of the transceiver, and wherein an input of the second operational amplifier is coupled to the first input line of the transceiver.

Example 3 may include the transceiver of example 2, wherein the input of the first operational amplifier that is coupled to the second input line of the transceiver is an inverting input of the first operational amplifier, the input of the second operational amplifier that is coupled to the first input line of the transceiver is an inverting input of the second operational amplifier, a non-inverting input of the first operational amplifier receives a common-mode voltage, and a non-inverting input of the second operational amplifier receives the common-mode voltage.

Example 4 may include the transceiver of example 2, wherein the output of the first operational amplifier is further coupled to the input of the first operational amplifier, and the output of the second operational amplifier is further coupled to the output of the second operational amplifier.

Example 5 may include the transceiver of example 2, wherein a first resistor is coupled between the common-mode choke and the output of the first operational amplifier, and a second resistor is coupled between the common-mode choke and the output of the second operational amplifier.

Example 6 may include the transceiver of example 1, wherein the filter circuitry further includes one or more capacitors coupled to the common-mode choke.

Example 7 may include the transceiver of example 1, wherein a first coil of the common-mode choke is coupled to a first input line of the transceiver, and a second coil of the common-mode choke is coupled to a second input line of the transceiver.

Example 8 may include a differential signal transmission system, comprising a first transceiver, including filter circuitry to implement band-pass filtering on a differential-mode component of an input signal of the first transceiver and to filter a common-mode component of the input signal of the first transceiver, and teeter-totter circuitry coupled to the filter circuitry, the teeter-totter circuitry to provide high impedance for the differential-mode component of the input signal of the first transceiver and low impedance for the common-mode component of the input signal of the first transceiver, and a second transceiver coupled to the first transceiver via a transmission line.

Example 9 may include the differential signal transmission system of example 8, wherein the teeter-totter circuitry includes a first operational amplifier with an output of the first operational amplifier coupled to a first output line of the first transceiver, wherein the first output line of the first transceiver corresponds to a first input line of the first transceiver, and wherein an input of the first operational amplifier is coupled to a second input line of the first transceiver, and a second operational amplifier with an output of the second operational amplifier coupled to a second output line of the first transceiver, wherein the second output line of the first transceiver corresponds to the second input line of the first transceiver, and wherein an input of the second operational amplifier is coupled to the first input line of the first transceiver.

Example 10 may include the differential signal transmission system of example 9, wherein the teeter-totter circuitry includes a first feedback loop that couples the output of the first operational amplifier with the input of the first operational amplifier, and a second feedback loop that couples the output of the second operational amplifier with the input of the second operational amplifier.

Example 11 may include the differential signal transmission system of example 8, wherein the filter circuitry includes a common-mode choke, wherein a first coil of the common-mode choke is coupled to a first input line of the first transceiver, and wherein a second coil of the common-mode choke is coupled to a second input line of the first transceiver.

Example 12 may include the differential signal transmission system of example 11, wherein the filter circuitry further includes a first capacitor coupled between the first input line of the first transceiver and the first coil of the common-mode choke, and a second capacitor coupled between the second input line of the first transceiver and the second coil of the common-mode choke.

Example 13 may include the differential signal transmission system of example 8, wherein the filter circuitry is first filter circuitry of the differential signal transmission system, where the teeter-totter circuitry is first teeter-totter circuitry of the differential signal transmission system, and wherein the second transceiver includes second filter circuitry to implement band-pass filtering on a differential-mode component of an input signal of the second transceiver and to filter a common-mode component of the input signal of the second transceiver, and second teeter-totter circuitry coupled to the second filter circuitry, the second teeter-totter circuitry to provide high impedance for the differential-mode component of the input signal of the second transceiver and low impedance for the common-mode component of the input signal of the second transceiver.

Example 14 may include the differential signal transmission system of example 13, further comprising a third transceiver coupled to the first transceiver and the second transceiver via the transmission line, wherein the third transceiver includes third filter circuitry to implement band-pass filtering on a differential-mode component of an input signal of the third transceiver and to filter a common-mode component of the input signal of the third transceiver, and third teeter-totter circuitry coupled to the third filter circuitry, the third teeter-totter circuitry to provide high impedance for the differential-mode component of the input signal of the third transceiver and low impedance for the common-mode component of the input signal of the third transceiver.

Example 15 may include the differential signal transmission system of example 8, wherein the transmission line comprises a full-duplex bus.

Example 16 may include the differential signal transmission system of example 8, wherein the differential signal transmission system comprises a LVDS transmission system.

Example 17 may include the differential signal transmission system of example 8, wherein the differential signal transmission system comprises a multipoint LVDS transmission system.

Example 18 may include a transceiver for a differential signal transmission system, comprising means for passing a differential-mode component of an input signal and filtering a common-mode component of the input signal, and means for providing high impedance for the differential-mode component of the input signal and providing low impedance for the common-mode component of the input signal.

Example 19 may include the transceiver of example 18, wherein the means for passing includes a common-mode choke coupled to an input of the means for providing, the common-mode choke to receive the input signal.

Example 20 may include the transceiver of example 18, wherein the means for providing includes a first operational amplifier with an output of the first operational amplifier coupled to a first output line of the transceiver, wherein the first output line corresponds to a first input line of the transceiver, and wherein an input of the first operational amplifier is coupled to a second input line of the transceiver, and a second operational amplifier with an output of the second operational amplifier coupled to a second output line of the transceiver, wherein the second output line corresponds to the second input line of the transceiver, and wherein an input of the second operational amplifier is coupled to the first input line of the transceiver.

The foregoing outlines features of one or more embodiments of the subject matter disclosed herein. These embodiments are provided to enable a person having ordinary skill in the art (PHOSITA) to better understand various aspects of the present disclosure. Certain well-understood terms, as well as underlying technologies and/or standards may be referenced without being described in detail. It is anticipated that the PHOSITA will possess or have access to background knowledge or information in those technologies and standards sufficient to practice the teachings of the present specification.

The PHOSITA will appreciate that they may readily use the present disclosure as a basis for designing or modifying other processes, structures, or variations for carrying out the same purposes and/or achieving the same advantages of the embodiments introduced herein. The PHOSITA will also recognize that such equivalent constructions do not depart from the spirit and scope of the present disclosure, and that they may make various changes, substitutions, and alterations herein without departing from the spirit and scope of the present disclosure.

Note that the subject matter (include the implementations) discussed above with reference to the FIGURES are applicable to any differential signal transmission system. For example, the transceivers (such as the transceiver 100 (FIG. 1)) and differential signal transmission systems described throughout this disclosure may be implemented in differential signal transmission systems that may present possibility of noise on the differential signals being transmitted. For example, the transceivers may be implemented in differential transmission systems in plastic enclosures with insufficient electromagnetic interference (EMI) shielding and/or transmission systems located adjacent to frequency converters that may be susceptible to noise.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Additionally, some of the components associated with described microprocessors may be removed, or otherwise consolidated. In a general sense, the arrangements depicted in the figures may be more logical in their representations, whereas a physical architecture may include various permutations, combinations, and/or hybrids of these elements. It is imperative to note that countless possible design configurations can be used to achieve the operational objectives outlined herein. Accordingly, the associated infrastructure has a myriad of substitute arrangements, design choices, device possibilities, hardware configurations, software implementations, equipment options, etc.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke 35 U.S.C. § 112(f) as it exists on the date of the filing hereof unless the words "means for" or "steps for" are specifically used in the particular claims; and (b) does not intend, by any statement in the specification, to limit this disclosure in any way that is not otherwise reflected in the appended claims.

What is claimed is:

1. A transceiver, comprising:
   filter circuitry including a common-mode choke, the filter circuitry to pass a differential-mode component of an input signal and filter a common-mode component of the input signal; and
   teeter-totter circuitry coupled to the filter circuitry, the teeter-totter circuitry to provide high impedance for the differential-mode component of the input signal and low impedance for the common-mode component of the input signal.

2. The transceiver of claim 1, wherein the teeter-totter circuitry includes:
   a first operational amplifier with an output of the first operational amplifier coupled to a first output line of the transceiver, wherein the first output line of the transceiver corresponds to a first input line of the transceiver, and wherein an input of the first operational amplifier is coupled to a second input line of the transceiver; and
   a second operational amplifier with an output of the second operational amplifier coupled to a second output line of the transceiver, wherein the second output line of the transceiver corresponds to the second input line of the transceiver, and wherein an input of the second operational amplifier is coupled to the first input line of the transceiver.

3. The transceiver of claim 2, wherein:
   the input of the first operational amplifier that is coupled to the second input line of the transceiver is an inverting input of the first operational amplifier;
   the input of the second operational amplifier that is coupled to the first input line of the transceiver is an inverting input of the second operational amplifier;
   a non-inverting input of the first operational amplifier receives a common-mode voltage; and
   a non-inverting input of the second operational amplifier receives the common-mode voltage.

4. The transceiver of claim 2, wherein:
   the output of the first operational amplifier is further coupled to the input of the first operational amplifier; and
   the output of the second operational amplifier is further coupled to the input of the second operational amplifier.

5. The transceiver of claim 2, wherein:
   a first resistor is coupled between the common-mode choke and the output of the first operational amplifier; and
   a second resistor is coupled between the common-mode choke and the output of the second operational amplifier.

6. The transceiver of claim 1, wherein the filter circuitry further includes one or more capacitors coupled to the common-mode choke.

7. The transceiver of claim 1, wherein:
   a first coil of the common-mode choke is coupled to a first input line of the transceiver; and
   a second coil of the common-mode choke is coupled to a second input line of the transceiver.

8. A differential signal transmission system, comprising:
   a first transceiver, including:
     filter circuitry to implement band-pass filtering on a differential-mode component of an input signal of the first transceiver and to filter a common-mode component of the input signal of the first transceiver; and
     teeter-totter circuitry coupled to the filter circuitry, the teeter-totter circuitry to provide high impedance for the differential-mode component of the input signal of the first transceiver and low impedance for the common-mode component of the input signal of the first transceiver; and
   a second transceiver coupled to the first transceiver via a transmission line.

9. The differential signal transmission system of claim 8, wherein the teeter-totter circuitry includes:
   a first operational amplifier with an output of the first operational amplifier coupled to a first output line of the first transceiver, wherein the first output line of the first transceiver corresponds to a first input line of the first transceiver, and wherein an input of the first operational amplifier is coupled to a second input line of the first transceiver; and
   a second operational amplifier with an output of the second operational amplifier coupled to a second output line of the first transceiver, wherein the second output line of the first transceiver corresponds to the second input line of the first transceiver, and wherein an input of the second operational amplifier is coupled to the first input line of the first transceiver.

10. The differential signal transmission system of claim 9, wherein the teeter-totter circuitry includes:
   a first feedback loop that couples the output of the first operational amplifier with the input of the first operational amplifier; and
   a second feedback loop that couples the output of the second operational amplifier with the input of the second operational amplifier.

11. The differential signal transmission system of claim 8, wherein the filter circuitry includes a common-mode choke, wherein a first coil of the common-mode choke is coupled to a first input line of the first transceiver, and wherein a second coil of the common-mode choke is coupled to a second input line of the first transceiver.

12. The differential signal transmission system of claim 11, wherein the filter circuitry further includes:
   a first capacitor coupled between the first input line of the first transceiver and the first coil of the common-mode choke; and
   a second capacitor coupled between the second input line of the first transceiver and the second coil of the common-mode choke.

13. The differential signal transmission system of claim 8, wherein the filter circuitry is first filter circuitry of the differential signal transmission system, where the teeter-totter circuitry is first teeter-totter circuitry of the differential signal transmission system, and wherein the second transceiver includes:
   second filter circuitry to implement band-pass filtering on a differential-mode component of an input signal of the second transceiver and to filter a common-mode component of the input signal of the second transceiver; and
   second teeter-totter circuitry coupled to the second filter circuitry, the second teeter-totter circuitry to provide high impedance for the differential-mode component of the input signal of the second transceiver and low impedance for the common-mode component of the input signal of the second transceiver.

14. The differential signal transmission system of claim 13, further comprising a third transceiver coupled to the first transceiver and the second transceiver via the transmission line, wherein the third transceiver includes:
   third filter circuitry to implement band-pass filtering on a differential-mode component of an input signal of the third transceiver and to filter a common-mode component of the input signal of the third transceiver; and
   third teeter-totter circuitry coupled to the third filter circuitry, the third teeter-totter circuitry to provide high impedance for the differential-mode component of the input signal of the third transceiver and low impedance for the common-mode component of the input signal of the third transceiver.

15. The differential signal transmission system of claim 8, wherein the transmission line comprises a full-duplex bus.

16. The differential signal transmission system of claim 8, wherein the differential signal transmission system comprises a low-voltage differential signaling transmission system.

17. The differential signal transmission system of claim 8, wherein the differential signal transmission system comprises a multipoint low-voltage differential signaling transmission system.

18. A transceiver for a differential signal transmission system, comprising:
   means for passing a differential-mode component of an input signal and filtering a common-mode component of the input signal; and
   means for providing high impedance for the differential-mode component of the input signal and providing low impedance for the common-mode component of the input signal.

19. The transceiver of claim 18, wherein the means for passing includes a common-mode choke coupled to an input of the means for providing, the common-mode choke to receive the input signal.

20. The transceiver of claim 18, wherein the means for providing includes:
   a first operational amplifier with an output of the first operational amplifier coupled to a first output line of the transceiver, wherein the first output line corresponds to a first input line of the transceiver, and wherein an input of the first operational amplifier is coupled to a second input line of the transceiver; and
   a second operational amplifier with an output of the second operational amplifier coupled to a second output line of the transceiver, wherein the second output line corresponds to the second input line of the transceiver, and wherein an input of the second operational amplifier is coupled to the first input line of the transceiver.

* * * * *